United States Patent
Lee et al.

(10) Patent No.: US 7,656,180 B2
(45) Date of Patent: Feb. 2, 2010

(54) BURN-IN BOARD CONNECTION DEVICE AND METHOD

(75) Inventors: Jae-Nam Lee, Chungcheongnam-do (KR); Jung-Hyeon Kim, Gyeonggi-do (KR); Ju-Il Kang, Chungcheongnam-do (KR); Jin-Woo Yang, Chungcheongnam-do (KR)

(73) Assignee: Samsung Electronics Co., Inc., Suwon-si, Gyeonggi-do (KR)

( * ) Notice: Subject to any disclaimer, the term of this patent is extended or adjusted under 35 U.S.C. 154(b) by 118 days.

(21) Appl. No.: 11/937,342

(22) Filed: Nov. 8, 2007

(65) Prior Publication Data

US 2008/0139024 A1 Jun. 12, 2008

(30) Foreign Application Priority Data

Dec. 6, 2006 (KR) .................... 10-2006-0123378

(51) Int. Cl.
*G01R 31/02* (2006.01)
(52) U.S. Cl. ........................ 324/760; 439/327
(58) Field of Classification Search ................ 439/153, 439/327, 325, 310, 372; 324/760, 719, 765
See application file for complete search history.

(56) References Cited

U.S. PATENT DOCUMENTS 5,093,984 A * 3/1992 Lape .................... 29/741
5,104,277 A * 4/1992 Bullock ................ 414/280
6,166,555 A * 12/2000 Lillja et al. ............ 324/760
6,844,717 B2 * 1/2005 Shim et al. ........... 324/158.1
6,876,192 B2 * 4/2005 Seppala et al. ........ 324/158.1
7,151,388 B2 * 12/2006 Gopal et al. .......... 324/765

FOREIGN PATENT DOCUMENTS

| JP | 08-101249 | 4/1996 |
| JP | 11-160395 | 6/1999 |
| JP | 2000-137054 | 5/2000 |
| KR | 1999-0062417 | 7/1999 |

OTHER PUBLICATIONS

English language abstract of Japanese Publication No. 08-101249.
English language abstract of Japanese Publication No. 11-160395.
English language abstract of Japanese Publication No. 2000-137054.

* cited by examiner

*Primary Examiner*—Michael C Zarroli
(74) *Attorney, Agent, or Firm*—Marger Johnson & McCollom, P.C.

(57) ABSTRACT

A burn-in board connection device includes a first connection unit to hold a burn-in board and move in a first direction perpendicular to the burn-in board that is inserted in a chamber of a burn-in test device, a second connection unit to move in a second direction parallel to the burn-in board to attach/detach the burn-in board that is held by the first connection unit to/from a connector disposed in the chamber. A burn-in board connection method includes coupling a finger to the burn-in board by moving the finger in a first direction, attaching the burn-in board to a connector by moving the finger in a second direction, and driving the finger by converting a rotation of a servo motor into a linear movement of the finger.

24 Claims, 7 Drawing Sheets

BURN-IN BOARD CONNECTION DEVICE AND METHOD

CROSS-REFERENCE TO RELATED PATENT APPLICATIONS

This application claims the benefit of Korean Patent Application No. 10-2006-0123378, filed on Dec. 6, 2006, in the Korean Intellectual Property Office, the disclosure of which is incorporated herein in its entirety by reference.

BACKGROUND OF THE INVENTION

1. Field of the Invention

The present invention relates to a semiconductor test device, and more particularly, to a burn-in board connection device, a burn-in test device including a burn-in board connection device, and a burn-in board connection method.

2. Description of the Related Art

After a semiconductor device passes a wafer-level test, it is cut from the wafer, packaged, and then subjected to a monitoring burn-in test (MBT) which is performed by a burn-in test device. In the MBT process, packaged devices are inserted in sockets on a burn-in board, the burn-in board is loaded on a rack that can receive multiple burn-in boards, and the rack is placed in a chamber of the burn-in test device for a predetermined time, during which electric signals and heat are applied to the packaged devices to test the reliability of the packaged devices under harsh conditions.

In the MBT process, a test signal line is connected between the packaged device mounted on the burn-in board and the burn-in test device to connect a main board disposed in the main body of the burn-in test device to the burn-in board. In addition, when the burn-in board is withdrawn from the burn-in test device after test is completed, the electric contact between the main board and the burn-in board must be separated.

The burn-in board is frequently attached/detached to/from a connector on the main board. During the attaching/detaching processes, problems such as defective contacts, abrasion due to friction, signal distortion due to an increase in contact resistance, and damage to connecting portions may occur between the connector of the main board and the burn-in board, and thus, errors increase in the reliability test process.

SUMMARY OF THE INVENTION

Embodiments of the present invention provide a burn-in board connection device, a burn-in test device including a burn-in board connection device, and a burn-in board connection method that can reduce errors during a reliability test regardless of attaching/detaching processes of a burn-in board.

According to an aspect of the present invention, there is provided a burn-in board connection device including: a first connection unit to move in a first direction perpendicular to a burn-in board and hold the burn-in board in a chamber of a burn-in test device; and a second connection unit to move in a second direction parallel to the burn-in board to attach/detach the burn-in board that is held by the first connection unit to/from a connector disposed in the chamber. The first connection unit and the second connection unit may be respectively driven by servo motors, and rotational speeds of the servo motors may be controlled to reduce shocks generated while attaching/detaching the burn-in board.

The first connection unit may include: a first servo motor; a finger to a engage finger recess formed in the burn-in board; a first frame, on which the finger is installed, to move in the first direction perpendicular to the burn-in board to engage the finger in the finger recess; and a first power transfer portion to convert the rotation of the first servo motor into a linear movement of the first frame.

The second connection unit may include: a second servo motor; a second frame connected to the first frame to move in the second direction parallel to the burn-in board to move the finger in the second direction; and a second power transfer portion to convert the rotation of the second servo motor into a linear movement of the second frame.

The first frame may move independently of the second frame in the first direction perpendicular to the burn-in board, while the first and second frames move together in the second direction parallel to the burn-in board.

The first frame and the second frame may be connected to each other by movably inserting a slider formed on the second frame into a slot formed in the first frame.

The power transfer portions may include lead screws that are respectively coupled to female screw portions formed in the first frame and the second frame and respectively connected to the first servo motor and the second servo motor.

The first servo motor may be fixed in the first direction perpendicular to the burn-in board and movable in the second direction parallel to the burn-in board, and the second servo motor may be fixed both in the first and second direction.

The connector may have a surface sloped at an angle to the direction of inserting the burn-in board. The sloped surface may comprise an upper surface or a lower surface of the connector.

The first connection unit may be constructed and arranged to shake the burn-in board in the first direction when the burn-in board is attached/detached to/from the connector.

The burn-in board connection device may further include: a compression unit to push the burn-in board when the burn-in board is inserted into the connector to firmly couple the burn-in board to the connector.

The compression unit may include: a compression rod to contact the burn-in board; and links to press the compression rod against the burn-in board when the burn-in board is inserted into the connector, and withdraw the compression rod from the burn-in board when the burn-in board is separated from the connector.

The links may include: a first link having an end portion connected to the compression rode and the other end portion connected to the chamber; and a second link having an end portion connecting to the compression rode and the other end portion connected to the second connection unit. The compression rod may extend at least to a length corresponding to a width of the burn-in board.

According to another aspect of the present invention, there is provided a burn-in test device including: a chamber including a connector, wherein a burn-in board to be tested is inserted in the chamber and attached to the connector; and a burn-in board connection device having a finger to move in a first direction to engage the burn-in board, and to move in a second direction to couple the burn-in board to the connector, wherein the burn-in board connection device converts a rotation of a servo motor into a linear movement of the finger.

The burn-in test device may further include: a controller to control a rotation speed of the servo motor so as to reduce shocks generated when the burn-in board is attached/detached to/from the connector.

The controller may control the finger to shake the burn-in board when the burn-in board is attached/detached to/from the connector.

The burn-in board connection device may include a compression unit to push the burn-in board to firmly couple the burn-in board to the connector when the burn-in board is inserted into the connector.

The compression unit may include: a compression rod to contact the burn-in board; and links to press the compression rod against the burn-in board when the burn-in board is inserted into the connector, and withdraw the compression rod from the burn-in board when the burn-in board is separated from the connector.

The connector may have a surface sloped at an angle inclined to the direction of inserting the burn-in board.

The burn-in board connection device may include: a first frame on which the finger is installed to move in the first direction to couple the finger to the burn-in board; a second frame connected to the first frame to move in the second direction to attach/detach the burn-in board to/from the connector; and a power transfer portion including lead screws to convert the rotation of the servo motor into linear movements of the first frame and the second frame. The first frame and the second frame may move independently from each other in the first direction, and move together in the second direction.

According to another aspect of the present invention, there is provided a burn-in board connecting method for connecting a burn-in board to a connector disposed in a chamber for testing the burn-in board, the method including: coupling a finger to the burn-in board by moving the finger in a first direction, attaching the burn-in board that is coupled to the finger to the connector by moving the finger in a second direction, and driving the finger by converting a rotation of a servo motor into a linear movement of the finger. The rotation speed of the servo motor may be controlled so as to reduce shocks generated during attaching/detaching of the burn-in board.

The finger may shake the burn-in board when the burn-in board is attached/detached to/from the connector.

When the burn-in board is inserted into the connector, a compression unit communicating with the finger may push the burn-in board so that the burn-in board is firmly coupled to the connector.

The connector may include a slope angle to reduce shocks generated during the attaching/detaching of the burn-in board.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein.

Figure 1:
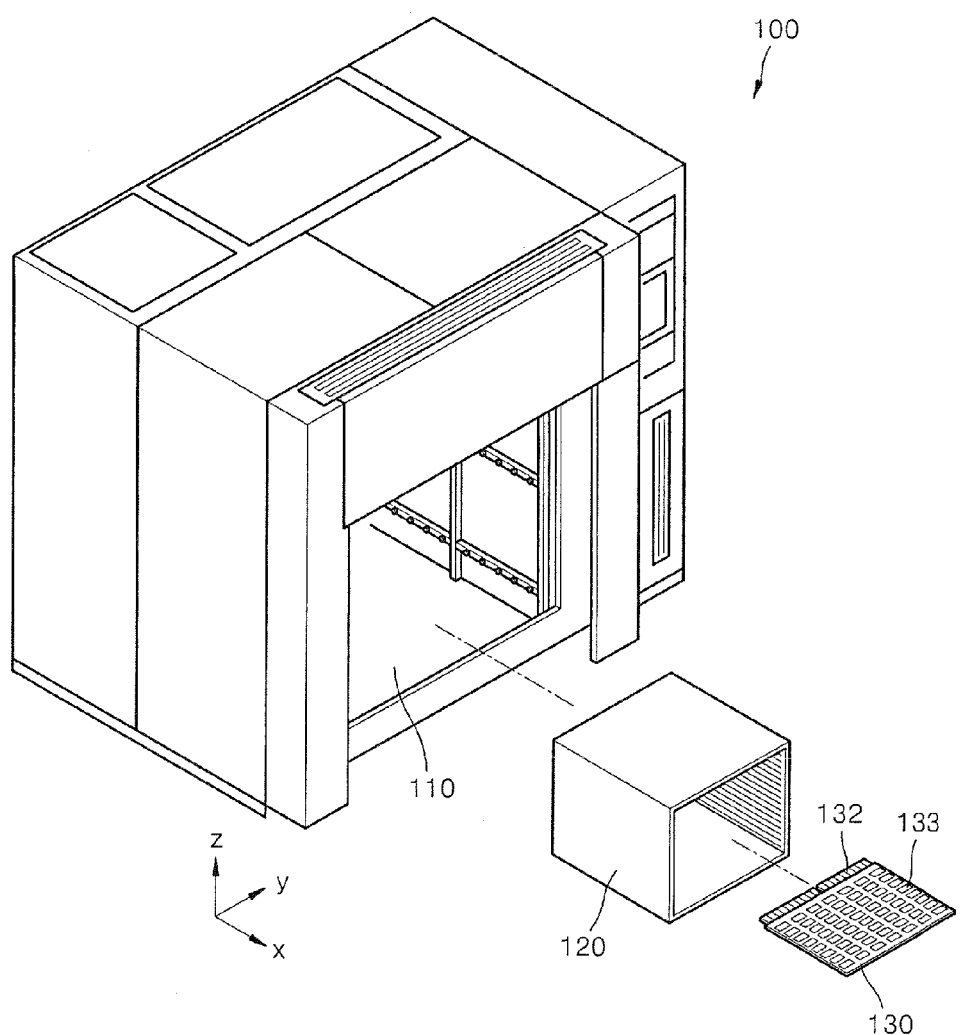
FIG. 1 is a perspective view of a burn-in test device according to an embodiment of the present invention.

FIG. 1 is a perspective view of a burn-in test device 100 according to an embodiment of the present invention. The burn-in test device 100 includes a chamber 110. A burn-in board 130 is loaded on a rack 120 which is inserted into the chamber 110. A device which has previously been tested in a wafer unit is fabricated as a packaged device 133, and the burn-in test device 100 performs a reliability test on the packaged device unit 133. A plurality of packaged devices 133 are arranged on the burn-in board 130, and a terminal portion 132 of the burn-in board 130 is connected to a connector (102, refer to FIG. 3) of a main board (not shown) disposed in the chamber 110 to receive signals and electric power.

Figure 2:
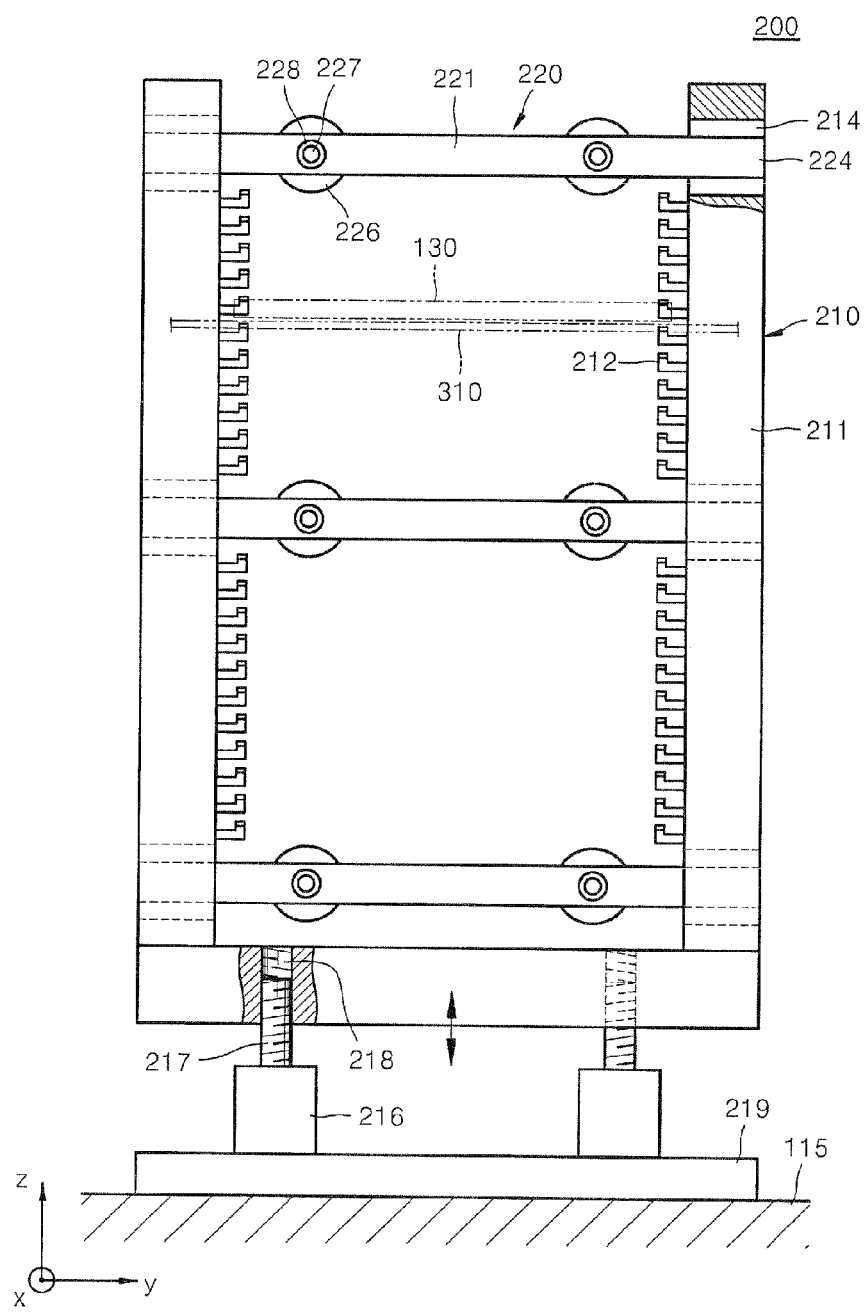
FIG. 2 is a front view of principle elements in the burn-in board connection device according to an embodiment of the present invention.
Figure 3:
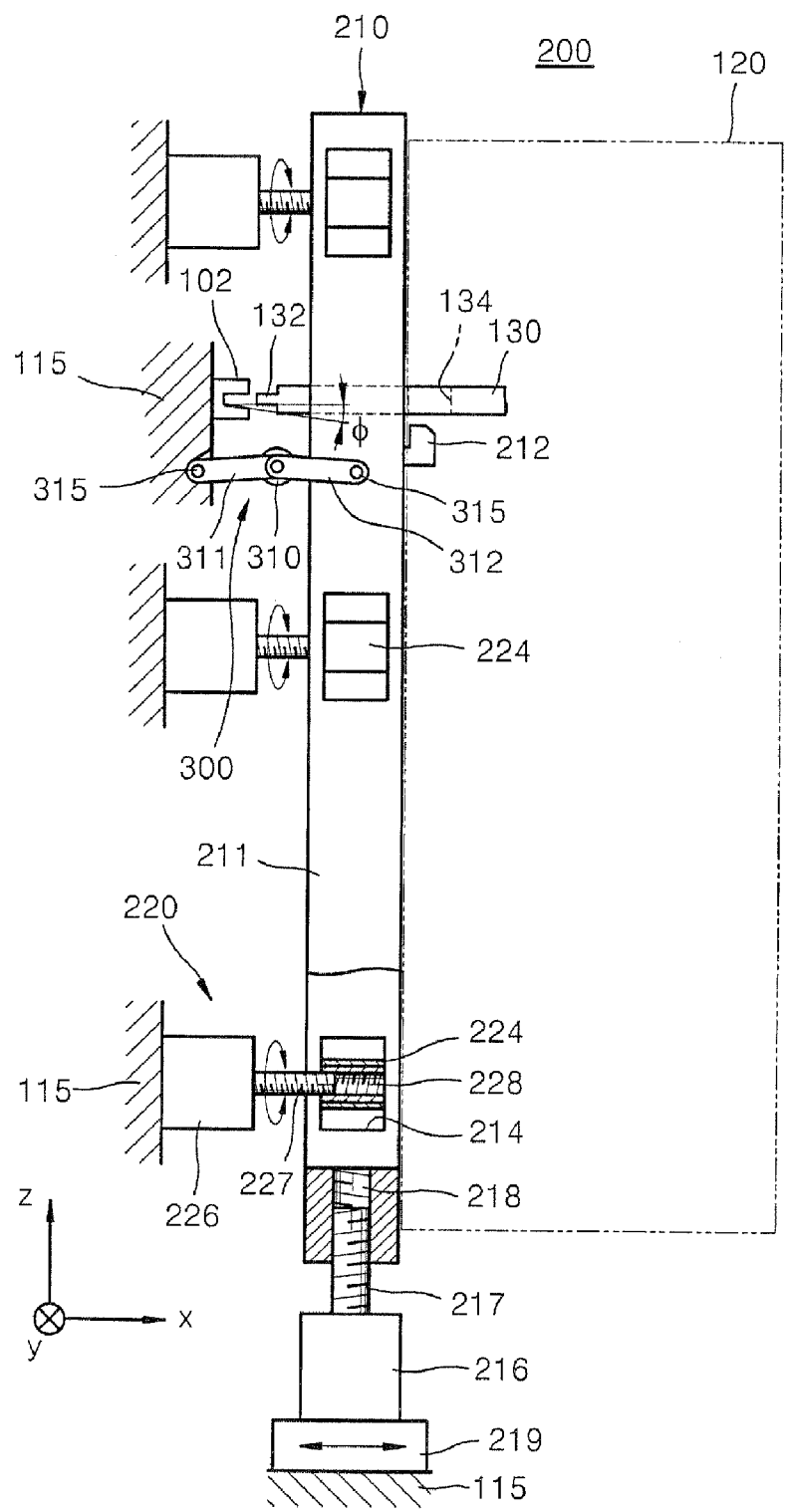
FIG. 3 is a side view of the burn-in board connection device in a state where a burn-in board is about to be inserted therein according to the embodiment of the present invention.

FIG. 2 is a front view showing principle elements of a burn-in board connection device according to an embodiment of the present invention. FIG. 3 is a side view of the burn-in board connection device in a state where the burn-in board is about to be inserted therein, and FIG. 4 is a side view of the burn-in board connection device in a state where the burn-in board is inserted therein.

Figure 4:
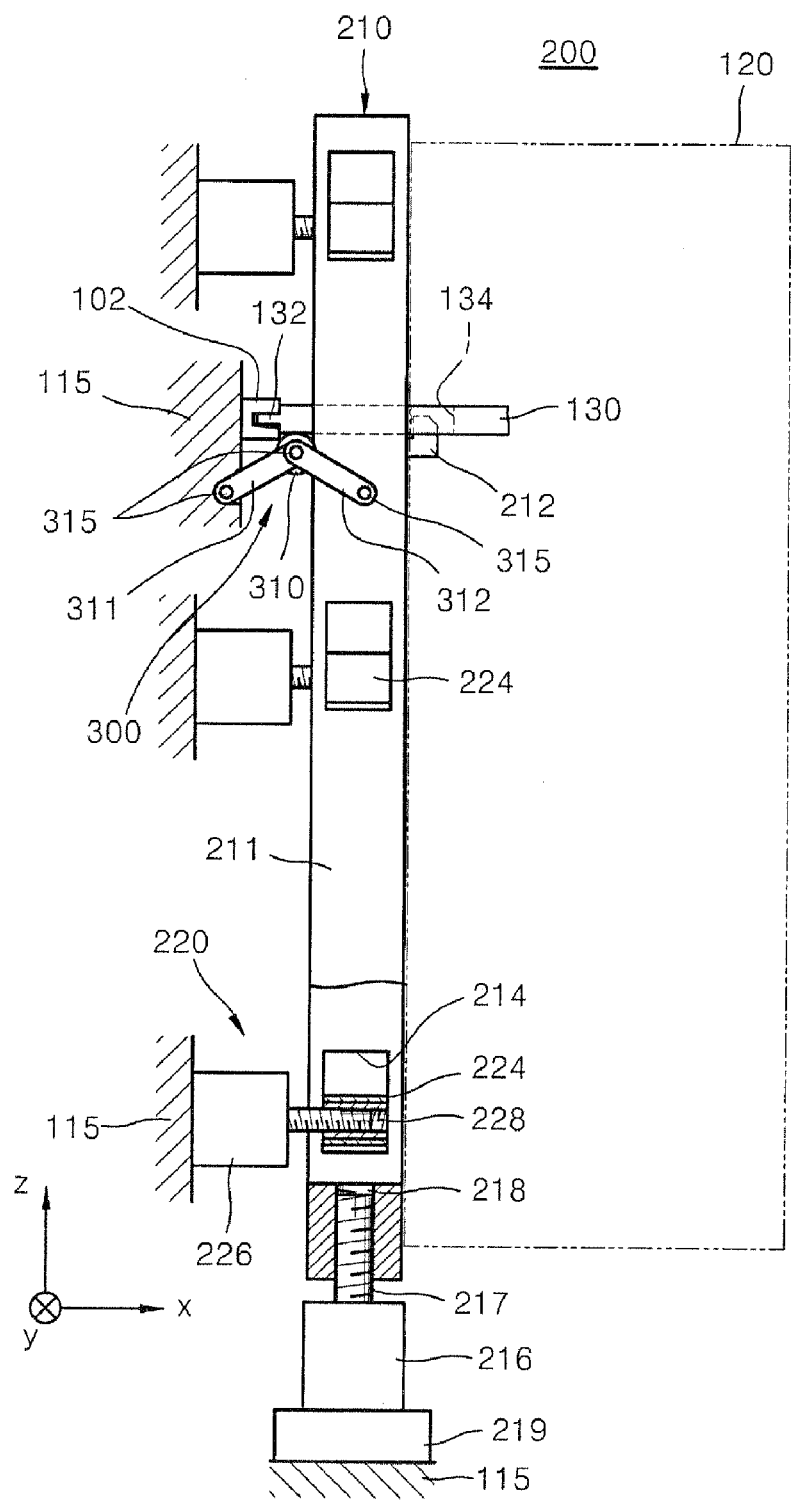
FIG. 4 is a side view of the burn-in board connection device in a state where the burn-in board is inserted therein according to the embodiment of the present invention.

Referring to FIGS. 2 through 4, the burn-in board connection device 200 includes a first connection unit 210 having a plurality of fingers 212, a second connection unit 220, and a compression unit 300. The plurality of fingers 212 are formed to hold a plurality of burn-in boards 130, however, only one finger 212 is shown in FIGS. 3 and 4 for convenience. In addition, the burn-in board connection device 200 includes a plurality of compression units 300 corresponding to the plurality of burn-in boards, however, only one compression unit 300 is shown in the drawings for convenience.

The burn-in board 130 inserted into the chamber 110 of the burn-in test device 100 is attached to the connector 102 by the burn-in board connection device 200 which includes the first connection unit 210 to hold the burn-in board 130 while it is being moved, and the second connection unit 220 to attach/detach the burn-in board 130 to/from the connector 102.

For example, the first connection unit 210 holds the burn-in board 130 while moving in a first direction, and the second connection unit 220 attaches/detaches the burn-in board 130 onto/from the connector 102 while moving in a second direction. According to the current embodiment, the first direction is a z-axis direction that is perpendicular to the burn-in board (i.e., the plane of the board) 130, and the second direction is an x-axis direction that is parallel to the burn-in board 130. However, the first and second directions are not limited thereto.

The burn-in board connection device 200 moves the finger 212 in the first direction in order to couple the finger 212 to the burn-in board 130, thereby holding the burn-in board 130, e.g., so that it is rotatable. The burn-in board connection device 200 moves the finger 212 in the second direction to insert the terminal portion 132 of the burn-in board 130 onto the connector 102.

As a comparative example, if the burn-in board 130 is handled using an actuator that operates on air pressure or fluid pressure, an excessive contact shock can be applied locally when the terminal portion 132 of the burn-in board 130 is connected to the connector 102, and thus, a connection defect may occur and the connected portion may be damaged. Therefore, according to the current embodiment, the burn-in board connection device 200 is driven using the rotations of servo motors 216 and 226, and thus, rapid changes in speed can be restricted, connecting shock can be reduced, and the device can be adjusted easily. The burn-in board connection device 200 converts the rotations of the servo motors 216 and 226 into the linear movement of the finger 212, and thus, the burn-in board 130 can be handled without damaging the terminal portion 132 of the burn-in board 130 and the connector 102 of the chamber 110.

The first connection unit 210 includes a first frame 211, a first servo motor 216, the finger 212, and a first power transfer portion including a lead screw 217 as described below. The first frame 211, on which the finger 212 is mounted, moves in a direction perpendicular to the burn-in board 130 with the finger 212 when the first servo motor 216 rotates. According to the current embodiment, when the first frame 211 moves upward, the finger 212 engages a finger recess 134, and when the first frame 211 moves downward, the finger 212 is separated from the finger recess 134. The number of the fingers 212 may be the same as that of the burn-in boards 130 on both sides of the burn-in boards 130 in the y-axis direction.

The second connection unit 220 includes a second frame 221, a second servo motor 226, and a second power transfer portion including lead screw 227 as described below. The second frame 221 is connected to the first frame 211, and thus, when the second servo motor 226 rotates, the second frame 221 and the first frame 211 move together in the second direction parallel to the burn-in board 130 with the finger 212 holding the burn-in board 130. That is, the first frame 211 moves in the first direction independently from the second frame 221, and the second frame 221 moves in the second direction together with the first frame 211 and the finger 212 holding the burn-in board 130.

An interference prevention unit prevents the second frame 221 from interfering with the first frame 211 when the first frame 211 moves in the first direction. The interference prevention unit includes a slot 214 formed in the first frame 211 and a slider 224 disposed on the second frame 221. The slider 224 is inserted into the slot 214 which restricts the movement of the slider 224 in the second direction. In addition, the first servo motor 216 is installed so as to be fixed in the direction perpendicular to the burn-in board 130 and movable in the second direction parallel to the burn-in board 130. That is, the first servo motor 216 is installed on a first servo motor fixing board 219 that is guided along a chamber frame 115 and moves in the second direction. The second servo motor 226 is installed directly on the chamber frame 115, and thus, is fixed in the first and second directions.

The first and second power transfer portions respectively include a lead screw 217 connecting to the first servo motor 216, and a lead screw 227 connecting to the second servo motor 226. In addition, the power transfer portions include a female screw portion 218 formed on the first frame 211, and a female screw portion 228 formed on the second frame 221. The lead screws 217 and 227 are respectively coupled to the female screw portions 218 and 228 so as to convert the rotations of the servo motors 216 and 226 into the linear movements of the first and second frames 211 and 221, respectively.

A plurality of first servo motors 216 and a plurality of first power transfer portions are disposed along the y-axis, a plurality of slots 214 are formed on the first frame 211, and the first frame 211 is guided by a plurality of sliders 224. Therefore, the first connection unit 210 moves linearly in the first direction, and vibration of the first connection unit 210 can be prevented. In addition, a plurality of second servo motors 226 and a plurality of second power transfer portions are disposed along the z-axis, and a plurality of sliders 224 are controlled so as to move by the identical displacement along the x-axis. Therefore, the first and second frames 211 and 221 move linearly in the second direction, and vibrations of the first and second frames 211 and 221 can be prevented.

The connector 102 has a surface that slopes at an angle ($\Phi$) from the direction of insertion of the burn-in board 130 so that the terminal portion 132 of the burn-in board 130 and the connector 102 can be easily attached/detached to/from each other. The slope angle ($\Phi$) may be formed with respect to either the upper surface or the lower surface of the connector 102 and the other surface of the connector 102 may not be inclined so that the terminal portion 132 of the burn-in board 130 and the connector 102 can be attached/detached to/from each other precisely in the second direction.

When the terminal portion 132 of the burn-in board 130 and the connector 102 are attached/detached, the burn-in board 130 may be shaken to improve the ease of attaching/detaching the burn-in board 130. As an example, when the second connection unit 220 moves in the second direction to attach/detach the burn-in board 130, the first frame 211, which can move independently of the second frame 221, reciprocates in the first direction to shake the burn-in board 130 in the first direction. Therefore, the terminal portion 132 and the connector 102 are not damaged during the attaching/detaching processes.

In addition, the compression unit 300 is disposed on side where the slope is formed in order to reinforce the connection state of the burn-in board 130. The compression unit 300 presses the burn-in board 130 when the burn-in board 130 is inserted so that the burn-in board 130 is firmly coupled to the connector 102. When the burn-in board 130 is separated, the compression unit 300 disengages from the burn-in board 130 to remove the compression force.

Figure 5:
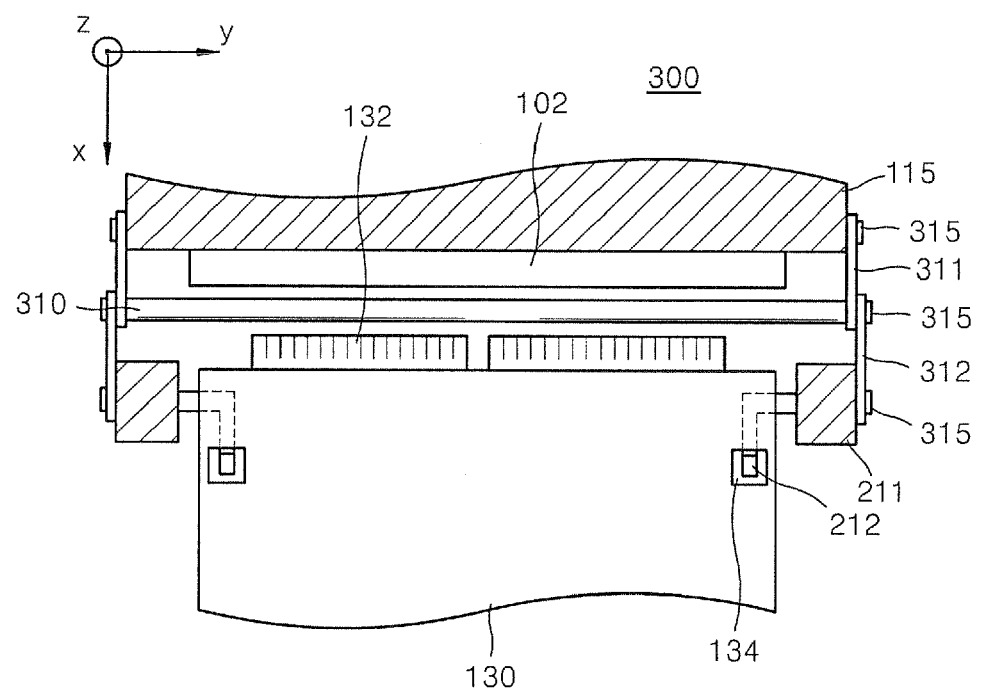
FIG. 5 is a plan view of a finger and a compression unit according to the embodiment of the present invention.

FIG. 5 is a plan view of principle elements of the finger 212 and the compression unit 300 according to an embodiment of the present invention. Referring to FIGS. 2 through 5, the compression unit 300 includes a compression rod 310 and links 311 and 312. In the current embodiment, in which the slope angle ($\Phi$) is defined with respect to the lower surface of the burn-in board 130, the compression rod 310 presses against the lower surface of the burn-in board 130 and may extend to a length corresponding to a width of the burn-in board 130. The links 311 and 312 move the compression rod 310 toward the position compressing the burn-in board 130, and withdraw the compression rod 310 from the burn-in board 310 when the burn-in board 130 is separated from the connector 102.

In order to smoothly move the compression rod 310, the links 311 and 312 may consist of a first link 311 and a second link 312 combined in a two-link joint structure. A first end portion of the first link 311 is connected to the compression rod 310 and the other end portion of the first link 311 is connected to the chamber frame 115 which form the walls of the chamber 110. A first end portion of the second link 312 is connected to the compression rod 310, and the other end portion of the second link 312 is connected to the second frame 221 of the second connection unit 220. Both end portions of the first and second links 311 and 312 are coupled to the compression rod 310, the chamber frame 115, and the second frame 221 using hinges 315, and thus, the first and second links 311 and 312 can rotate.

Figure 6:
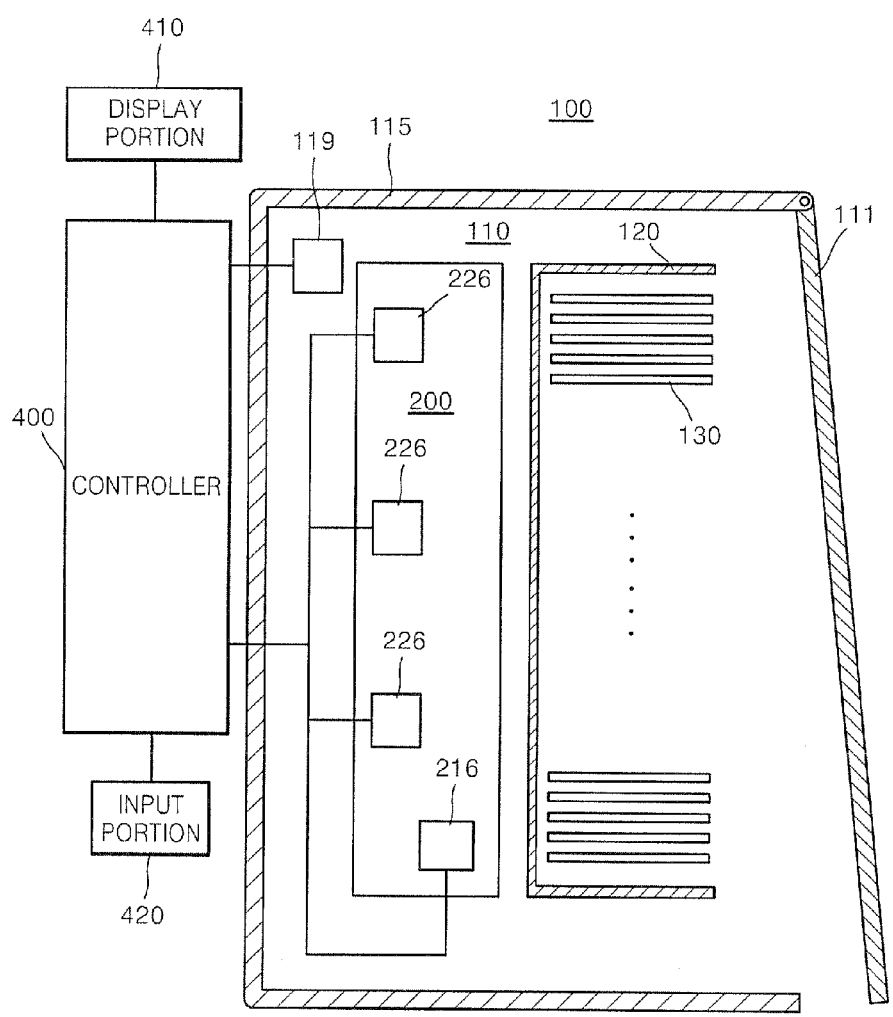
FIG. 6 is a block diagram of a burn-in test device according to an embodiment of the present invention.
Figure 7:
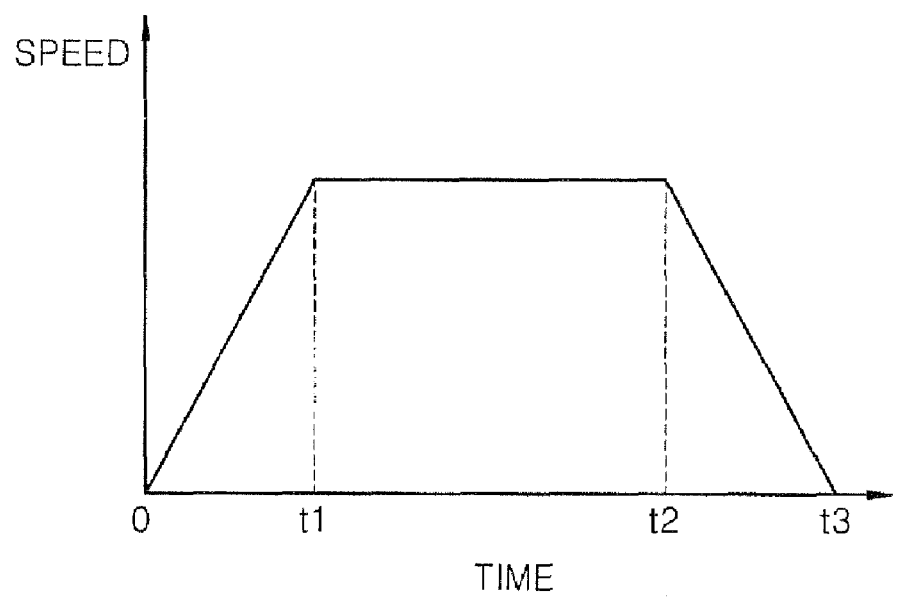
FIG. 7 is a graph illustrating a rotation speed of a servo motor according to an embodiment of the present invention.

FIG. 6 is a block diagram of the burn-in test device 100 according to an embodiment of the present invention. FIG. 7 is a graph showing rotational speeds of the servo motors 216 and 226 of the current embodiment. A method of connecting the burn-in test device 100 and the burn-in board 130 will be described with reference to FIGS. 2 through 7. Elements that are already described above are not described here. The burn-in test device 100 of the current embodiment includes the chamber 110, the burn-in board connection device 200, and a controller 400. The burn-in test device 100 can further include an input portion 420, through which a test command is input, and a display portion 410 for displaying test results. The burn-in board 130 loaded on the rack 120 is inserted into the chamber 110 through a door 111.

The controller 400 controls the test conditions in the chamber 110 using a chamber sensor 119, and controls the rotational speeds of the first and second servo motors 216 and 226 in order to reduce the shocks generating during the attaching/detaching processes. In the method of connecting the burn-in board 130 of the current embodiment, the finger 212 is moved in the first direction to couple the finger 212 to the burn-in board 130, and the finger 212 is moved in the second direction so that the burn-in board 130 coupled to the finger 212 is attached/detached to/from the connector 102. The rotations of the first and second servo motors 216 and 226 are converted into linear movements to drive the finger 212.

In FIG. 7, the horizontal axis denotes time, and the vertical axis denotes rotational speeds of the first and second servo motors 216 and 226. In order to reduce the shocks generated in the attaching/detaching processes of the burn-in board 130, the first and second servo motors 216 and 226 are linearly accelerated during an acceleration period (0~t1), the first and second servo motors 216 and 226 are rotated at a constant speed during a constant speed period (t1~t2), and the rotational speeds of the first and second servo motors 216 and 226 are linearly reduced during a deceleration period (t2~t3). While the rotational speeds of the first and second servo motors 216 and 226 change during the acceleration periods, the constant speed period, and the deceleration period, a cycle of operation for inserting or separating the burn-in board 130 into/from the connector 102 is completed. If the rapid acceleration or deceleration of the rotational speed of the first and second servo motors 216 and 226 are restricted, the contacting shock of the burn-in board 130 can be greatly reduced.

When the burn-in board 130 is attached/detached, the controller 400 can control the finger 212 so as to shake the burn-in board 130. For example, when the finger 212 moves in the second direction and the burn-in board 130 is inserted by the rotation of the second servo motor 226, the first servo motor 216 is rotated in a right reverse direction for a predetermined time to shake the burn-in board 130 in the first direction, and thus, the burn-in board 130 can be inserted easily.

Moreover, because of the slope angle (Φ) between the connector 102 and the compression unit 300 compresses the burn-in board, the burn-in board 130 can be firmly coupled and the attaching/detaching operations can be performed smoothly.

In addition, if impurities exist between the coupling surfaces of the slots 214 and the sliders 224, or if an error occurs in one of the power transfer portions, the rotations of the first and second servo motors 216 and 226 are restricted, thereby causing an overcurrent condition. Upon sensing the overload of the first and second servo motors 216 and 226, the controller 400 suspends the operation of the first and second servo motors 216 and 226, and thus, unexpected damage to the burn-in test device 100 can be prevented. That is, the controller 400 senses the loads of the first servo motor 210 and the second servo motor 226 to sense whether an error has occurred in the first connection unit 210 or the second connection unit 220, and when an overload of the first or second servo motors 216 and 226 is sensed, the controller 400 suspends the operation of the burn-in board connection device 200 in order to prevent the burn-in board 130 or the burn-in test device 100 from being damaged.

According to embodiments of a burn-in board connection device, a burn-in test device, and a burn-in board connection method of the present invention, damage to the burn-in board and the burn-in test device can be prevented regardless of frequent attaching/detaching operations of the burn-in board for testing the reliability in MBT test equipment. In addition, abrasion or vibration due to the contact friction between the burn-in board and the connector during the MBT test can be prevented, and thus, distortion of the test signals caused by the defective contacts can be prevented. Accordingly, the operating ratio of the equipment can be improved, and thus, processing time can be reduced, mass-productivity can be improved, and the quality of the test can be improved. In addition, in consideration of the price of the burn-in board and the burn-in test device, the quality of the device can be greatly improved at a relatively low cost for improving the burn-in board connection device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A burn-in board connection device comprising:
    a first connection unit to move in a first direction perpendicular to a burn-in board and hold the burn-in board in a chamber of a burn-in test device; and
    a second connection unit to move in a second direction parallel to the burn-in board to attach/detach the burn-in board that is held by the first connection unit to/from a connector disposed in the chamber;
    wherein the first connection unit is constructed and arranged to shake the burn-in board in the first direction when the burn-in board is attached/detached to/from the connector.

2. The burn-in board connection device of claim 1, wherein the first connection unit and the second connection unit are driven by servo motors, and rotational speeds of the servo motors are controlled to reduce shocks generated while attaching/detaching the burn-in board.

3. The burn-in board connection device of claim 2, wherein the first connection unit comprises:
    a first servo motor;
    a finger to engage a finger recess formed in the burn-in board;
    a first frame, on which the finger is installed, to move in the first direction perpendicular to the burn-in board to engage the finger in the finger recess; and
    a first power transfer portion to convert rotation of the first servo motor into a linear movement of the first frame.

4. The burn-in board connection device of claim 3, wherein the second connection unit comprises:
    a second servo motor;
    a second frame connected to the first frame to move in the second direction parallel to the burn-in board to move the finger in the second direction; and
    a second power transfer portion to convert the rotation of the second servo motor into a linear movement of the second frame.

5. The burn-in board connection device of claim 4, wherein the first frame moves independently of the second frame in the first direction perpendicular to the burn-in board, and the first and second frames move together in the second direction parallel to the burn-in board.

6. The burn-in board connection device of claim 4, wherein the first frame and the second frame are connected to each other by movably inserting a slider formed on the second frame into a slot formed in the first frame.

7. The burn-in board connection device of claim 4, wherein the power transfer portions include lead screws that are respectively coupled to female screw portions formed in the first frame and the second frame and respectively connected to the first servo motor and the second servo motor.

8. The burn-in board connection device of claim 2, wherein the first servo motor is fixed in the first direction perpendicular to the burn-in board and movable in the second direction parallel to the burn-in board, and the second servo motor is fixed in both the first and second directions.

9. The burn-in board connection device of claim 1, wherein the connector has a surface sloped at an angle to the insertion direction of the burn-in board.

10. The burn-in board connection device of claim 9, wherein the sloped surface comprises an upper surface or a lower surface of the connector.

11. The burn-in board connection device of claim 1, further comprising a compression unit to push the burn-in board when the burn-in board is inserted into the connector to firmly couple the burn-in board to the connector.

12. The burn-in board connection device of claim 11, wherein the compression unit comprises:
   a compression rod to contact the burn-in board; and
   links to press the compression rod against the burn-in board when the burn-in board is inserted into the connector, and withdraw the compression rod from the burn-in board when the burn-in board is separated from the connector.

13. The burn-in board connection device of claim 12, wherein the links comprise:
   a first link having a first end connected to the compression rode and a second end connected to the chamber; and
   a second link having a first end connected to the compression rode and a second end connected to the second connection unit.

14. The burn-in board connection device of claim 13, wherein the compression rod extends at least to a length corresponding to a width of the burn-in board.

15. A burn-in test device comprising:
   a chamber including a connector, wherein a burn-in board to be tested is inserted in the chamber and attached to the connector;
   a burn-in board connection device having a finger to move in a first direction to engage the burn-in board, and to move in a second direction to couple the burn-in board to the connector, wherein the burn-in board connection device converts a rotation of a servo motor into a linear movement of the finger and
   a controller to control a rotation speed of the servo motor so as to reduce shocks generated when the burn-in board is attached/detached to/from the connector;
   wherein the controller controls the finger to shake the burn-in board when the burn-in board is attached/detached to/from the connector.

16. The burn-in test device of claim 15, wherein the burn-in board connection device comprises a compression unit to push the burn-in board to firmly couple the burn-in board to the connector when the burn-in board is inserted into the connector.

17. The burn-in test device of claim 16, wherein the compression unit comprises:
   a compression rod to contact the burn-in board; and
   links to press the compression rod against the burn-in board when the burn-in board is inserted into the connector, and withdraw the compression rod from the burn-in board when the burn-in board is separated from the connector.

18. The burn-in test device of claim 15, wherein the connector has a surface sloped at an angle to the insertion direction of the burn-in board.

19. The burn-in test device of claim 15, wherein the first direction is substantially perpendicular to the burn-in board, and the second direction is substantially parallel to the burn-in board.

20. The burn-in test device of claim 15, wherein the burn-in board connection device comprises:
   a first frame on which the finger is installed to move in the first direction to couple the finger to the burn-in board;
   a second frame connected to the first frame to move in the second direction to attach/detach the burn-in board to/from the connector; and
   a power transfer portion including lead screws to convert the rotation of the servo motor into linear movement of the first frame and the second frame.

21. The burn-in test device of claim 20, wherein the first frame moves independently of the second frame in the first direction, and the first and second frames move together in the second direction.

22. A method for connecting a burn-in board to a connector disposed in a chamber for testing the burn-in board, the method comprising:
   coupling a finger to the burn-in board by moving the finger in a first direction;
   attaching the burn-in board to the connector by moving the finger in a second direction;
   driving the finger by converting a rotation of a servo motor into a linear movement of the finger;
   controlling a rotation speed of the servo motor so as to reduce shocks generated during attaching/detaching of the burn-in board; and
   shaking the burn-in board when the burn-in board is attached/detached to/from the connector.

23. The method of claim 22, further comprising pressing against the burn-in board in a direction perpendicular to the burn-in board when the burn-in board is inserted into the connector.

24. The method of claim 23, wherein the connector includes a slope angle to reduce shocks generated when the burn-in board is attached/detached to/from the connector.

* * * * *

UNITED STATES PATENT AND TRADEMARK OFFICE
CERTIFICATE OF CORRECTION

PATENT NO. : 7,656,180 B2
APPLICATION NO. : 11/937342
DATED : February 2, 2010
INVENTOR(S) : Jae-Nam Lee et al.

It is certified that error appears in the above-identified patent and that said Letters Patent is hereby corrected as shown below:

Title Page, Item (75) the Inventor "Ju-II Kang" should read -- Ju-Il Kang --;

Column 10, line 56, the words "claim 23," should read -- claim 22, --.

Signed and Sealed this

Eleventh Day of May, 2010

David J. Kappos
*Director of the United States Patent and Trademark Office*